US009640597B2

(12) United States Patent
Dai et al.

(10) Patent No.: US 9,640,597 B2
(45) Date of Patent: May 2, 2017

(54) ORGANIC LIGHT-EMITTING DIODE (OLED) SUBSTRATE AND DISPLAY DEVICE

(71) Applicant: BOE TECHNOLOGY GROUP CO., LTD., Beijing (CN)

(72) Inventors: Qing Dai, Beijing (CN); Li Sun, Beijing (CN); Ze Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/347,390

(22) PCT Filed: Aug. 6, 2013

(86) PCT No.: PCT/CN2013/080859
§ 371 (c)(1),
(2) Date: Mar. 26, 2014

(87) PCT Pub. No.: WO2014/190616
PCT Pub. Date: Dec. 4, 2014

(65) Prior Publication Data
US 2015/0028310 A1 Jan. 29, 2015

(30) Foreign Application Priority Data
May 30, 2013 (CN) .......................... 2013 1 0210261

(51) Int. Cl.
H01L 29/08 (2006.01)
H01L 35/24 (2006.01)
(Continued)

(52) U.S. Cl.
CPC ...... H01L 27/3246 (2013.01); H01L 51/0012 (2013.01); H01L 51/5056 (2013.01);
(Continued)

(58) Field of Classification Search
CPC .......................... H01L 27/3246; H01L 27/3211
(Continued)

(56) References Cited

U.S. PATENT DOCUMENTS 6,476,988 B1 * 11/2002 Yudasaka ............... G02B 5/201
313/113
7,902,750 B2 3/2011 Takei et al.
(Continued)

FOREIGN PATENT DOCUMENTS

CN 101060071 A 10/2007
CN 101533852 A 9/2009
(Continued)

OTHER PUBLICATIONS

International Search Report mailed Mar. 13, 2014; PCT/CN2013/080859.
(Continued)

Primary Examiner — Meiya Li
Assistant Examiner — Peter M Albrecht
(74) Attorney, Agent, or Firm — Ladas & Parry LLP

(57) ABSTRACT

An organic light-emitting diode (OLED) substrate, which includes a plurality of light-emitting sub-pixels and a pixel partition wall, wherein at least one layer among hole injection layers (HIL), hole transport layers (HTL) and organic light-emitting layers of at least two light-emitting sub-pixels has a different thickness; and upper surfaces of the HIL, the HTL and the organic light-emitting layer of any light-emitting sub-pixel are each parallel and level to an upper surface of one respective lyophilic film layer of the pixel partition wall. The OLED substrate can be used for improving the surface smoothness of each organic layer of the light-emitting sub-pixel. The embodiment of the present invention further provides a display device.

12 Claims, 7 Drawing Sheets

(51) Int. Cl.
*H01L 51/00* (2006.01)
*H01L 27/32* (2006.01)
*H01L 51/50* (2006.01)

(52) U.S. Cl.
CPC ...... *H01L 51/5088* (2013.01); *H01L 27/3211* (2013.01); *H01L 51/0003* (2013.01); *H01L 2251/558* (2013.01)

(58) Field of Classification Search
USPC .......................................................... 257/40
See application file for complete search history.

(56) References Cited

U.S. PATENT DOCUMENTS

| | | | |
|---|---|---|---|
| 8,836,214 | B2 | 9/2014 | Gregory et al. |
| 2006/0220543 | A1 | 10/2006 | Makiura |
| 2006/0255735 | A1 | 11/2006 | Moriya et al. |
| 2007/0246723 | A1 | 10/2007 | Moriya et al. |
| 2009/0231243 | A1 | 9/2009 | Song |
| 2011/0101317 | A1 | 5/2011 | Gregory et al. |
| 2012/0049210 | A1 | 3/2012 | Takagi |
| 2012/0097933 | A1* | 4/2012 | Ando ................... H01L 51/001 257/40 |
| 2013/0134450 | A1* | 5/2013 | Chang et al. .................... 257/88 |
| 2013/0277649 | A1 | 10/2013 | Gregory et al. |
| 2014/0139102 | A1 | 5/2014 | Jeon et al. |
| 2015/0001473 | A1 | 1/2015 | Ahn et al. |
| 2016/0017213 | A1 | 1/2016 | Zhang et al. |
| 2016/0020429 | A1 | 1/2016 | Kuroki |

FOREIGN PATENT DOCUMENTS

| | | |
|---|---|---|
| CN | 102184937 A | 9/2011 |
| CN | 102386206 A | 3/2012 |
| CN | 103187434 A | 7/2013 |
| CN | 203277508 U | 11/2013 |
| JP | 2008-004376 A | 1/2008 |
| JP | 2008004376 A * | 1/2008 |
| WO | 2014161269 A1 | 9/2014 |

OTHER PUBLICATIONS

First Chinese Office Action Appln. No. 201310210261.1; Dated Apr. 7, 2015.
Second Chinese Office Action dated Jun. 25, 2015; Appln. No. 201310210261.1.
International Preliminary Report on Patentability issued Oct. 6, 2015; PCT/CN2013/083144.
International Preliminary Report on Patentability issued Dec. 1, 2015; PCT/CN2013/080859.
International Search Report Appln. No. PCT/CN2013/083144; Dated Jan. 9, 2014.
First Chinese Office Action Appln. No. 201310110257.8; Dated Jan. 3, 2014.
Rejection Decision Appln. No. 201310110257.8; Dated Jul. 9, 2014.
Reexamination Notification Appln. No. 201310110257.8; Dated Mar. 20, 2015.
USPTO OA U.S. Appl. No. 14/342,246, dated Aug. 18, 2015.
3M, "Novec™ Electronic Coating—EGC-1700 Product Details", 3M Website, Accessed on Sep. 30, 2015.
USPTO NFOA dated Mar. 15, 2016 in connection with U.S. Appl. No. 14/342,246.
Biao Zuo, et al; "Surface Properties of Poly(vinyl alcohol) Films Dominated by Spontaneous Adsorption of Ethanol and Governed by Hydrogen Bonding", The Journal of Physical Chemistry, vol. 117; pp. 3396-3406; Published Jan. 28, 2013.
International Preliminary Report on Patentability issued Oct. 6, 2016; PCT/CN2013/083144.
USPTO FOA dated Jun. 29, 2016 in connection with U.S. Appl. No. 14/342,246.

* cited by examiner

ORGANIC LIGHT-EMITTING DIODE (OLED) SUBSTRATE AND DISPLAY DEVICE

TECHNICAL FIELD

Embodiments of the present invention relate to an organic light-emitting diode (OLED) substrate and a display device.

BACKGROUND

An OLED display is a new kind of display device. Compared with a liquid crystal display (LCD), an OLED display has the advantages such as self-illumination, fast response speed, wide viewing angle and the like, can be used for flexible display, transparent display and three-dimensional (3D) display, and hence is rapidly developed and popularized.

An OLED display comprises an OLED substrate (a substrate provided with an OLED structure thereon), an adhesive film and a packaging cover. The OLED substrate comprises a base substrate, light-emitting sub-pixels disposed on the base substrate, and a pixel partition wall disposed on the base substrate and configured to separate the light-emitting sub-pixels. A light-emitting sub-pixel includes an anode, a hole injection layer (HIL), a hole transport layer (HTL) and an organic light-emitting layer which are stacked on the substrate in sequence, and the HIL, the HTL and the organic light-emitting layer are organic layers. A pixel partition wall includes lyophilic films and lyophobic films which are alternately stacked; a lyophilic film is disposed on the bottommost layer of the pixel partition wall; and a lyophobic film is disposed on the upmost layer of the pixel partition wall.

Currently, the number of film layers of a pixel partition wall corresponding to the anode and the HIL of the light-emitting sub-pixel is equal to 1; the number of film layers of a pixel partition wall corresponding to the HTL of the light-emitting sub-pixel is equal to 2; and the number of film layers of a pixel partition wall corresponding to the organic light-emitting layer of the light-emitting sub-pixel is equal to 2. In summary, as for various light-emitting sub-pixels of the OLED substrate, same organic layers of various light-emitting sub-pixels can only have equal thicknesses currently.

SUMMARY

Embodiments of the present invention provide an OLED substrate and a display device, which can solve the problem that the same organic layers of light-emitting sub-pixels can only have equal thickness as for the light-emitting sub-pixels of the OLED substrate, and can be used for improving the surface smoothness of each organic layer of the light-emitting sub-pixels.

In one aspect, the present invention provides an OLED substrate, which comprises: a base substrate, a plurality of light-emitting sub-pixels disposed on the base substrate, and a pixel partition wall disposed on the base substrate and configured to separate the light-emitting sub-pixels. Each of the light-emitting sub-pixels includes an anode, an HIL, an HTL and an organic light-emitting layer which are stacked on the substrate in sequence. The pixel partition wall includes lyophilic film layers and lyophobic film layers; a lyophilic film layer is disposed on the bottommost layer of the pixel partition wall; a lyophobic film layer is disposed on the upmost layer of the pixel partition wall; at least one layer among an HIL, an HTL and an organic light-emitting layers for at least two light-emitting sub-pixel has a different thickness; and upper surfaces of the HIL, the HTL and the organic light-emitting layer of any light-emitting sub-pixel are each parallel and level to an upper surface of one respective lyophilic film layer of the pixel partition wall.

In another aspect, the present invention provides a display device, which comprises the OLED substrate.

In the embodiment of the present invention, as the upper surfaces of the HIL, the HTL and the organic light-emitting layer of any light-emitting sub-pixel are each parallel and level to the upper surface of one lyophilic film layer of the pixel partition wall, the organic material liquid drops falling into a sub-pixel region can be guaranteed not to climb up along a sidewall of the pixel partition wall when each organic layer of the light-emitting sub-pixel is prepared through a wet process, and hence the surface smoothness of each organic layer formed after the drying of the organic material liquid drops falling into the sub-pixel region can be improved.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

Figure 1:
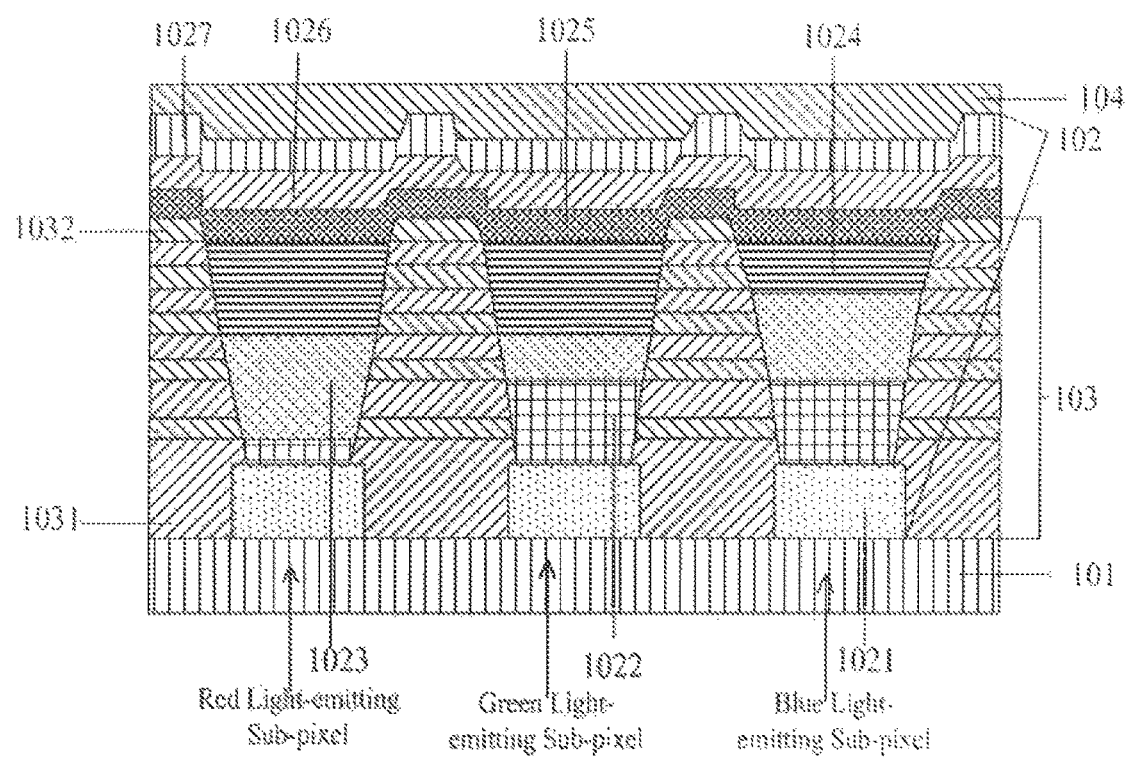
FIG. 1 is a schematic structural view of an OLED substrate provided by an embodiment of the present invention.

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

In one embodiment of the present invention, the OLED substrate comprises a base substrate, light-emitting sub-pixels disposed on the base substrate, and a pixel partition wall disposed on the base substrate and configured to separate the light-emitting sub-pixels. Each of the light-emitting sub-pixels includes an anode, an HIL, an HTL and an organic light-emitting layer which are stacked on the base substrate in sequence. The pixel partition wall includes lyophilic film layers and lyophobic film layers which are alternately stacked; a lyophilic film layer is disposed on the bottommost layer of the pixel partition wall; and a lyophobic film layer is disposed on the upmost layer of the pixel partition wall. In the OLED substrate, at least two light-emitting sub-pixels are provided; at least one layer of the HIL, the HTL and the organic light-emitting layer has a different thickness for the at least two light-emitting sub-pixels; and upper surfaces of the HIL, the HTL and the organic light-emitting layer of any light-emitting sub-pixel are each parallel and level to an upper surface of one respective lyophilic film layer of the pixel partition wall respectively.

In the plurality of light-emitting sub-pixels in the OLED substrate provided by an embodiment of the present invention, at least one layer of the HIL, the HTL and the organic light-emitting layer has a different thickness for the at least two light-emitting sub-pixels. In actual application, in order to improve the display performance (e.g., luminous efficiency and luminescent lifetime) of the display device, the OLED substrate of the display device is required to be provided with at least two light-emitting sub-pixels, and at least one layer of the HIL, the HTL and the organic light-emitting layer has a different thickness for the at least two light-emitting sub-pixels, and therefore the display device comprising the OLED substrate provided by the embodiment of the present invention has higher display performance.

As the upper surfaces of the HIL, the HTL and the organic light-emitting layer of any light-emitting sub-pixel are each parallel and level to the upper surface of one respective lyophilic film layer of the pixel partition wall, an organic material liquid drop falling into a sub-pixel region can be guaranteed not to climb up along a sidewall of the pixel partition wall when each organic layer of the light-emitting sub-pixel is prepared through a wet process, and hence the surface smoothness of each organic layer formed after the drying of the organic material liquid drop falling into the sub-pixel region can be improved.

It should be noted that the OLED substrate provided by the embodiment of the present invention is a substrate provided with an OLED structure thereon.

As illustrated in FIG. 1, the OLED substrate provided by one embodiment of the present invention comprises a base substrate 101, light-emitting sub-pixels 102 disposed on the base substrate 101, and a pixel partition wall 103 disposed on the base substrate 101 and configured to separate the light-emitting sub-pixels 102.

A light-emitting sub-pixel 102 includes an anode 1021, an HIL 1022, an HTL 1023 and an organic light-emitting layer 1024 which are stacked on the base substrate 101 in sequence. The HIL 1022, the HTL 1023 and the organic light-emitting layer 1024 are organic layers.

The pixel partition wall 103 includes lyophilic film layers 1031 and lyophobic film layers 1032 which are alternately stacked; a lyophilic film layer 1031 is disposed on the bottommost layer of the pixel partition wall; and a lyophobic film layer is disposed on the upmost layer of the pixel partition wall.

At least two light-emitting sub-pixels 102 are provided; at least one layer of the HIL 1022, the HTL 1023 and the organic light-emitting layer 1024 for the at least two light-emitting sub-pixels 102 has a different thickness; and upper surfaces of the HIL 1022, the HTL 1023 and the organic light-emitting layer 1024 of any light-emitting sub-pixel 102 are parallel and level to an upper surface of one respective lyophilic film layer 1031 of the pixel partition wall 103.

For instance, the pixel partition walls 103 of the OLED substrate provided by the embodiments of the present invention may be implemented in a same way.

For instance, the configuration in which at least two light-emitting sub-pixels 102 are provided and at least one layer of the HIL 1022, the HTL 1023 and the organic light-emitting layer 1024 for the at least two light-emitting sub-pixels has a different thickness can be implemented in various ways. Any implementation is applicable to the present invention. Three possible implementations will be given below.

For instance, at least two light-emitting sub-pixels 102 are provided, and the respective HILs 1022 thereof have different thicknesses; at least two light-emitting sub-pixels 102 are provided, the respective HILs 1022 thereof have different thicknesses, and the respective HTLs 1023 thereof have different thicknesses; and at least two light-emitting sub-pixels 102 are provided, the respective HILs 1022 thereof have different thicknesses, the respective HTLs 1023 thereof have different thicknesses, and the organic light-emitting layers 1024 thereof have different thicknesses.

For instance, the number of film layers of the pixel partition wall 103 corresponding to the anode 1021 and the HIL 1022 is an odd number; and the number of film layers of the pixel partition wall 103 corresponding to the HTL 1023 or the organic light-emitting layer 1024 is an even number.

For instance, as illustrated in FIG. 1, three light-emitting sub-pixels 102 of the OLED substrate are a red light-emitting sub-pixel, a green light-emitting sub-pixel and a blue light-emitting sub-pixel respectively. The number of film layers of the pixel partition wall 103 corresponding to the anode 1021 and the HIL 1022 of the red light-emitting sub-pixel is 1; the number of film layers of the pixel partition wall 103 corresponding to the anode 1021 and the HIL 1022 of the green light-emitting sub-pixel is 3; and the number of film layers of the pixel partition wall 103 corresponding to the anode 1021 and the HIL 1022 of the blue light-emitting sub-pixel is 3.

Moreover, the number of film layers of the pixel partition wall 103 corresponding to the HTL 1023 of the red light-emitting sub-pixel is 4; the number of film layers of the pixel partition wall 103 corresponding to the HTL 1023 of the green light-emitting sub-pixel is 2; and the number of film layers of the pixel partition wall 103 corresponding to the HTL 1023 of the blue light-emitting sub-pixel is 4.

Furthermore, the number of film layers of the pixel partition wall 103 corresponding to the organic light-emitting layer 1024 of the red light-emitting sub-pixel is 4; the number of film layers of the pixel partition wall 103 corresponding to the organic light-emitting layer 1024 of the green light-emitting sub-pixel is 4; and the number of film layers of the pixel partition wall 103 corresponding to the organic light-emitting layer 1024 of the blue light-emitting sub-pixel is 2.

In addition, the pixel partition wall 103 includes lyophilic film layers 1031 and lyophobic film layers 1032 which are alternately stacked; a lyophilic film layer 1031 is disposed on the bottommost layer of the pixel partition wall 103; and a lyophobic film layer 1032 is disposed on the upmost layer of the pixel partition wall 103.

When the number of film layers of the pixel partition wall 103 corresponding to the anode 1021 and the HIL 1022 is an odd number, the upper surface of the HIL 1022 can be guaranteed to be parallel and level to the upper surface of one lyophilic film layer 1031 of the pixel partition wall 103, and hence the organic material liquid drop falling into a sub-pixel region can be guaranteed not to climb up along a sidewall of the pixel partition wall when the HIL 1022 is prepared through a wet process, and consequently the surface smoothness of the HIL 1022 formed after the drying of the organic material liquid drops falling into the sub-pixel region can be improved.

Moreover, when the number of film layers of the pixel partition wall 103 corresponding to the HTL 1023 or the organic light-emitting layer 1024 is an even number, the upper surfaces of the HTL 1023 and the organic light-emitting layer 1024 each can be guaranteed to be parallel and level to the upper surface of one lyophilic film layer 1031 of the pixel partition wall 103, and hence the surface smoothness of the HTL 1023 and the organic light-emitting layer 1024 formed after the drying of the organic material liquid drops falling into the sub-pixel region can be improved.

For instance, where the HILs 1022 of the light-emitting sub-pixels 102 have different thicknesses, the numbers of film layers of the pixel partition wall 103 corresponding to the anodes 1021 and the HILs 1022 are different; and the number of film layers of the pixel partition wall 103 corresponding to the anode 1021 and the HIL 1022 of a larger thickness is greater than the number of film layers of the pixel partition wall 103 corresponding to the anode 1021 and the HIL 1022 of a smaller thickness. For instance, as illustrated in FIG. 1, three light-emitting sub-pixels 102 of the OLED substrate are respectively a red light-emitting sub-pixel, a green light-emitting sub-pixel and a blue light-emitting sub-pixel; and the thickness of the HIL 1022 of the red light-emitting sub-pixel is less than that of the HIL 1022 of the green light-emitting sub-pixel. Therefore, the number of film layers (one layer) of the pixel partition wall 103 corresponding to the anode 1021 and the HIL 1022 of the red light-emitting sub-pixel is less than the number of film layers (three layers) of the pixel partition wall 103 corresponding to the anode 1021 and the HIL 1022 of the green light-emitting sub-pixel.

For instance, at least two light-emitting sub-pixels 102 are provided, and the HILs 1022 of the at least two light-emitting sub-pixels have different thicknesses; and the number of film layers of the pixel partition wall 103 corresponding to an anode 1021 and the thickest HIL 1022 is greater than 1, and the number of film layers of the pixel partition wall 103 corresponding to an anode 1021 and the thinnest HIL 1022 is not less than 1.

For instance, the number of film layers of the pixel partition wall 103 corresponding to the anode 1021 and the thickest HIL 1022 is an odd number greater than 1. Preferably, the number of film layers of the pixel partition wall 103 corresponding to the anode 1021 and the thickest HIL 1022 is any odd number greater than 1, for instance, 3, 5 or 7, which can be set according to specific needs or experience.

For instance, the number of film layers of the pixel partition wall 103 corresponding to the anode 1021 and the thinnest HIL 1022 is an odd number not less than 1. That is to say, the number of film layers of the pixel partition wall 103 corresponding to the anode 1021 and the thinnest HIL 1022 may be 1 and may also be an odd number greater than 1, such as 3.

For instance, where the HILs 1022 of the light-emitting sub-pixels 102 have an equal thickness, the process for forming the HILs 1022 and the pixel partition wall 103 may be the same as or different from the traditional process for forming the HILs and the pixel partition wall.

For instance, the number of film layers of the pixel partition wall 103 corresponding to the anode 1021 and the HIL 1022 is 1 (namely the lyophilic film layer 1031 disposed on the bottommost layer of the pixel partition wall 103); or the number of film layers of the pixel partition wall 103 corresponding to the anode 1021 and the HIL 1022 is an odd number greater than 1.

For instance, where the HTLs 1023 of the light-emitting sub-pixels 102 have different thicknesses, the numbers of film layers of pixel partition wall 103 corresponding to the HTLs 1023 are different as well; and the number of film layers of the pixel partition wall 103 corresponding to an HTL 1023 with a larger thickness is greater than the number of film layers of the pixel partition wall 103 corresponding to an HTL 1023 with a smaller thickness.

For instance, as illustrated in FIG. 1, three light-emitting sub-pixels 102 of the OLED substrate are respectively a red light-emitting sub-pixel, a green light-emitting sub-pixel and a blue light-emitting sub-pixel; and the thickness of the HTL 1023 of the red light-emitting sub-pixel is greater than that of the HTL 1023 of the green light-emitting sub-pixel. Therefore, the number of film layers (four layers) of the pixel partition wall 103 corresponding to the HTL 1023 of the red light-emitting sub-pixel is greater than the number of film layers (two layers) of the pixel partition wall 103 corresponding to the HTL 1023 of the green light-emitting sub-pixel.

For instance, at least two light-emitting sub-pixels 102 are provided, and the HTLs 1023 of the at least two light-emitting sub-pixels 102 have different thicknesses; and the number of film layers of the pixel partition wall 103 corresponding to the thickest HTL 1023 is greater than 2, and the number of film layers of the pixel partition wall 103 corresponding to the thinnest HTL 1023 is not less than 2.

For instance, the number of film layers of the pixel partition wall 103 corresponding to the thickest HTL 1023 is an even number greater than 2. Preferably, the number of film layers of the pixel partition wall 103 corresponding to the thickest HTL 1023 is any even number greater than 2, for instance, 4, 6 or 8, which can be set according to specific needs or experience.

For instance, the number of film layers of the pixel partition wall 103 corresponding to the thinnest HTL 1023 is an even number not less than 2. That is to say, the number of film layers of the pixel partition wall 103 corresponding to the thinnest HTL 1023 may be 2 and may also be an even number greater than 2, for example 4.

Where the HTLs 1023 of the light-emitting sub-pixels 102 have an equal thickness, the implementation of the HTLs 1023 and the pixel partition wall 103 may be the same as or different from the traditional process for forming the HTLs and the pixel partition wall.

For instance, the number of film layers of the pixel partition wall 103 corresponding to the HTL 1023 is 2; or the number of film layers of the pixel partition wall 103 corresponding to the HTL 1023 is an even number greater than 2.

For instance, where the organic light-emitting layers 1024 of the light-emitting sub-pixels 102 have different thicknesses, the numbers of film layers of the pixel partition wall 103 corresponding to the organic light-emitting layers 1024 are also different from each other; and the number of film layers of the pixel partition wall 103 corresponding to the thickest organic light-emitting layer 1024 is greater than the number of film layers of the pixel partition wall 103 corresponding to the thinnest organic light-emitting layer 1024. For instance, as illustrated in FIG. 1, three light-emitting sub-pixels 102 of the OLED substrate are respectively a red light-emitting sub-pixel, a green light-emitting sub-pixel and a blue light-emitting sub-pixel. The thickness of the organic light-emitting layer 1024 of the green light-emitting sub-pixel is greater than that of the organic light-emitting layer 1024 of the blue light-emitting sub-pixel. Therefore, the number of film layers (four layers) of the pixel partition wall 103 corresponding to the organic light-emitting layer 1024 of the green light-emitting sub-pixel is greater than the number of film layers (two layers) of the pixel partition wall 103 corresponding to the organic light-emitting layer 1024 of the blue light-emitting sub-pixel.

For instance, at least two light-emitting sub-pixels 102 are provided, and organic light-emitting layers 1024 of the at least two light-emitting sub-pixels 102 have different thicknesses; and the number of film layers of the pixel partition wall 103 corresponding to the thickest organic light-emitting layer 1024 is greater than 2, and the number of film layers of the pixel partition wall 103 corresponding to the thinnest organic light-emitting layer 1024 is not less than 2.

For instance, the number of film layers of the pixel partition wall 103 corresponding to the thickest organic light-emitting layer 1024 is an even number greater than 2. Preferably, the number of film layers of the pixel partition wall 103 corresponding to the thickest organic light-emitting layer 1024 is any even number greater than 2, for instance, 4, 6 or 8, which can be set according to specific needs or experience.

For instance, the number of film layers of the pixel partition wall 103 corresponding to the thinnest organic light-emitting layer 1024 is an even number not less than 2. That is to say, the number of film layers of the pixel partition wall 103 corresponding to the thinnest organic light-emitting layer 1024 may be 2 and may also be an even number greater than 2, for example 4.

For instance, where the organic light-emitting layers 1024 of the light-emitting sub-pixels 102 have a same thickness, the process for forming the organic light-emitting layers 1024 and the pixel partition wall 103 may be the same as or different from the traditional process for forming the organic light-emitting layers and the pixel partition wall.

For instance, the number of film layers of the pixel partition wall 103 corresponding to the organic light-emitting layer 1024 is 2; or the number of film layers of the pixel partition wall 103 corresponding to the organic light-emitting layer 1024 is an even number greater than 2.

For instance, the light-emitting sub-pixel 102 includes a red light-emitting sub-pixel, a green light-emitting sub-pixel and a blue light-emitting sub-pixel.

For instance, the base substrate 101 may be similar to a base substrate in the traditional OLED substrate.

For instance, the base substrate 101 is made of one or more materials selected from the group consisting of quartz, glass, metal foil, resin film and resin sheet. For instance, resin includes polymethyl methacrylate (PMMA), polyethylene terephthalate (PET), polyethylene naphthalate (PEN) and polycarbonate resins.

Preferably, the base substrate 101 may be used for preventing water and gas from penetrating through the OLED substrate.

Preferably, the base substrate 101 of an OLED substrate of a bottom-emission display device has good transparency (i.e., having light permeability in the visible wavelength range).

For instance, the process for forming the anodes 1021 may be similar to the process for forming anodes in the traditional OLED substrate.

For instance, the anode 1021 is a film made of a simple substance, an alloy or an oxide of chromium (Cr), gold (Au), platinum (Pt), Nickel (Ni), copper (Cu), tungsten (W), aluminum (Al) and silver (Ag), for instance, a transparent conductive film made of indium tin oxide (ITO), indium zinc oxide (InZnO) or zinc oxide (ZnO).

For instance, the process for forming the HILs 1022 may be similar to the process for forming the HILs in the traditional OLED substrate.

Preferably, the HIL 1022 is used for improving the hole injection ability and modifying the surface of the anode 1021 so as to have buffer function.

For instance, the process for forming the HTLs 1023 may be similar to the process for forming the HTLs in the traditional OLED substrate.

For instance, the HTL 1023 may be made of a polymeric material, for instance, polyvinylcarbazole and derivatives thereof, polyfluorene and derivatives thereof, polyaniline and derivatives thereof, polysilane and derivatives thereof, polysiloxane, of which a main chain or a branched chain has an arylamine structure, and derivatives thereof, polythiophene and derivatives thereof, polypyrrole and the like.

For instance, the weight average molecular weight (WAMW) of the polymeric material of the HTL 1023 is 50,000 to 300,000. Preferably the WAMW of the polymeric material of the HTL 1023 is 100,000 to 200,000.

For instance, the thickness of the HTL 1023 is ranged from 10 to 200 nm. Preferably, the thickness of the HTL 1023 is ranged from 15 to 150 nm.

For instance, the process for forming the organic light-emitting layers 1024 may be similar to the process for forming organic light-emitting layers in the traditional OLED substrate.

For instance, the thickness of the organic light-emitting layer 1024 is ranged from 10 to 200 nm. Preferably, the thickness of the organic light-emitting layer 1024 is ranged from 15 to 100 nm.

For instance, the organic light-emitting layer 1024 may be made of a small molecular weight material and/or a high molecular polymer.

For instance, the high molecular polymers include polyfluorene and derivatives thereof, poly(1,4-phenylenevinylene) derivatives, polyphenylene derivatives, polyvinyl carbazole derivatives, polythiophene derivatives and the like; and the small molecular weight materials include perinaphthene pigment, coumarin pigment, rhodamine pigment, fluorescein pigment, pyrene, anthracene and derivatives thereof, diene or polyene derivatives and the like.

For instance, the lyophilic film layers 1031 and the lyophobic film layers 1032 may have a same thickness and may also have different thicknesses.

For instance, the thicknesses of the lyophilic film layers 1031 or the lyophobic film layers 1032 are ranged from 5 to 100 nm. Preferably, the thicknesses of the lyophilic film layers 1031 or the lyophobic film layers 1032 are ranged from 5 to 20 nm.

For instance, the lyophilic film layers 1031 and/or the lyophobic film layers 1032 may be made of inorganic materials and/or organic materials.

For instance, the lyophilic film layers 1031 may be made of inorganic materials with controllable deposition rate and/or organic materials with polar groups.

For instance, the inorganic materials with controllable deposition rate include silicon oxide ($SiO_x$), silicon nitride ($SiN_x$), silicon oxynitride ($SiN_xO_y$), titanium oxide ($TiO_x$), aluminum oxide ($Al_xO_y$) and the like.

In a particular example, the surface roughness of an inorganic material may be controlled by the control of the deposition rate of the inorganic material, so that the lyophilicity property of the lyophilic film layers 1031 can be achieved.

For instance, the organic materials with polar groups include hydroxy, mercapto, amino, carboxyl and amido polymers and the like, for instance, polyhydroxystyrene derivatives, phenolic resin derivatives, polymethacrylate derivatives, polyvinyl alcohol derivatives, poly(cinnamate) derivatives and the like.

For instance, the lyophobic film layers 1032 may be made of inorganic materials with controllable deposition rate and/or organic materials with low surface energy.

For instance, the inorganic materials with controllable deposition rate include silicon oxide ($SiO_x$), silicon nitride ($SiN_x$) silicon oxynitride ($SiN_xO_y$), titanium oxide ($TiO_x$), aluminum oxide ($Al_xO_y$) and the like.

In a particular example, the surface roughness of an inorganic material may be controlled by the control of the deposition rate of the inorganic material, so that the lyophobicity property of the lyophobic film layer 1032 can be achieved.

For instance, the organic materials with low surface energy include fluorinated polymeric materials, such as fluorinated polyacrylates or polymethacrylates, fluorinated polyimide derivatives, fluorinated siloxane derivatives, fluorinated carbic anhydride derivatives, fluorinated maleic anhydride derivatives, fluorinated epoxides and the like.

For instance, the light-emitting sub-pixel 102 each further includes an electron transport layer (ETL) 1025, an electron injection layer (EIL) 1026 and a cathode 1027 which are stacked on the organic light-emitting layer 1024 and the pixel partition wall 103 in sequence.

For instance, the process for forming the ETL 1025, the EIL 1026 and the cathode 1027 may be similar to the process for forming an ETL, an EIL and cathode in a traditional OLED substrate.

For instance, the ETL 1025 is made of a material comprising quinoline and derivatives or metal complexes thereof, perylene and derivatives or metal complexes thereof, phenanthroline and derivatives or metal complexes thereof, diphenylethene and derivatives or metal complexes thereof, pyrimidine and derivatives or metal complexes thereof, triazole and derivatives or metal complexes thereof, oxazole and derivatives or metal complexes thereof, fullerene and derivatives or metal complexes thereof, oxadiazole and derivatives or metal complexes thereof, fluorenone and derivatives or metal complexes thereof and the like.

For instance, the EIL 1026 is made of a material comprising an oxide/composite oxide/fluoride/alloy of a metal such as alkaline-earth metal, alkali metal and a metal having a low work function, for instance, lithium oxide ($Li_2O$), fluoride (LiF), and cesium composite oxide ($Cs_2CO_3$).

For instance, the cathode is a film made of a single substance, an alloy or an oxide of metallic elements such as aluminum (Al), magnesium (Mg), calcium (Ca), sodium (Na), gold (Au), silver (Ag), copper (Cu), chromium (Cr), platinum (Pt) and nickel (Ni), for instance, indium tin oxide (ITO), indium zinc oxide (InZnO) and zinc oxide (ZnO).

For instance, the thickness of the cathode 1027 is ranged from 5 to 1,000 nm. Preferably, the thickness of the cathode 1027 is ranged from 10 to 150 nm.

For instance, the OLED substrate provided by the embodiment of the present invention further comprises a protection layer 104 disposed on the cathodes 1027 of the light-emitting sub-pixels 102.

For instance, the process for forming the protection layer 104 may be similar to the process for forming a protection layer in the traditional OLED substrate. For instance, the thickness of the protection layer 104 is ranged from 2 to 3 micrometers. For instance, the protection layer 104 is made of an insulating material or a conductive material. For instance, the insulating material include an inorganic amorphous insulating material such as amorphous silicon ($\alpha$-Si), amorphous silicon carbide ($\alpha$-SiC), amorphous silicon nitride ($\alpha$-SiN), amorphous carbon ($\alpha$-C) and silicon dioxide ($SiO_2$).

Description will be given below to the OLED substrate provided by an embodiment of the present invention in which not all the same organic layers of the light-emitting sub-pixels 102 have an equal thickness, by taking the case that the plurality of the light-emitting sub-pixels 102 of the OLED substrate comprise the red light-emitting sub-pixel, the green light-emitting sub-pixel and the blue light-emitting sub-pixel as an example.

Embodiment 1

In embodiment 1 of the present invention, description will be given to the implementation in which the organic layer is an HIL 1022.

Figure 2:
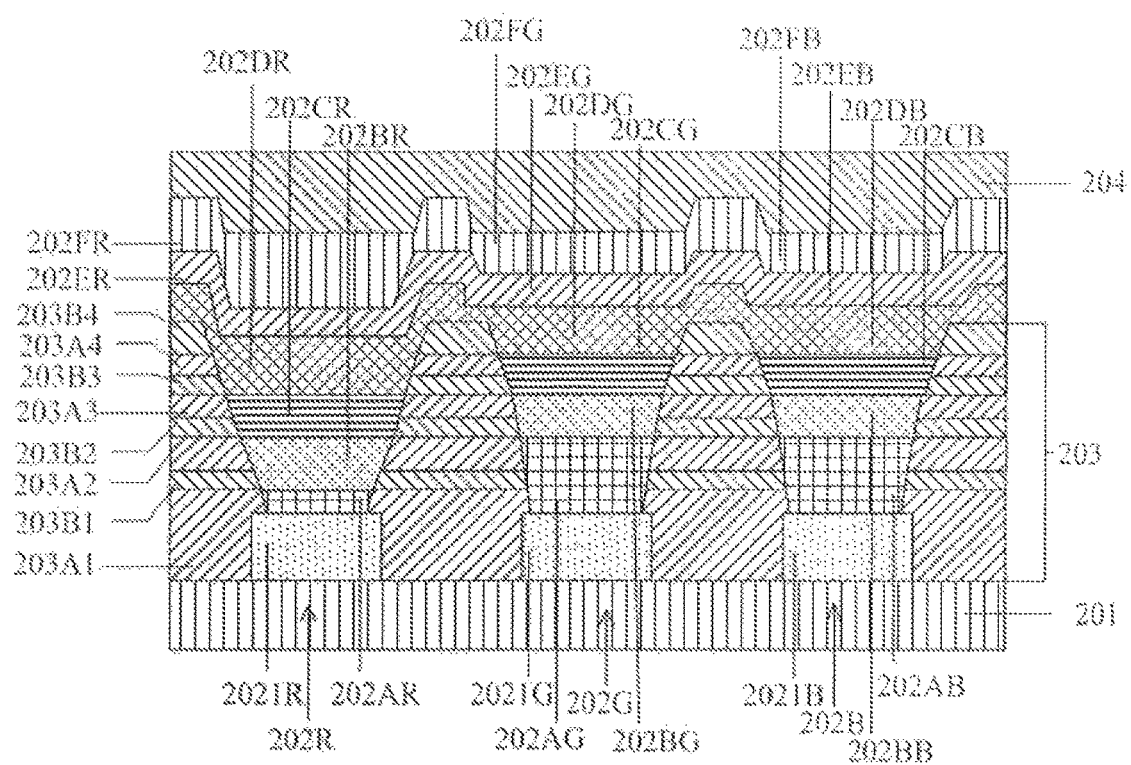
FIG. 2 is a schematic structural view of the OLED substrate provided by an embodiment of the present invention, in which HILs have different thicknesses.

As illustrated in FIG. 2, the OLED substrate provided by the embodiment of the present invention comprises a base substrate 201, a red light-emitting sub-pixel 202R, a green light-emitting sub-pixel 202G and a blue light-emitting sub-pixel 202B which are disposed on the base substrate 201, a pixel partition wall 203 which are disposed in regions not covered by the light-emitting sub-pixels on the base substrate 201, and a protection layer 204 which is disposed on the red light-emitting sub-pixel 202R, the green light-emitting sub-pixel 202G and the blue light-emitting sub-pixel 202B.

The red light-emitting sub-pixel 202R includes an anode 2021R, an HIL 202AR, an HTL 202BR, an organic light-emitting layer 202CR, an ETL 202DR, an EIL 202ER and a cathode 202FR. The green light-emitting sub-pixel 202G includes an anode 2021G, an HIL 202AG, an HTL 202BG, an organic light-emitting layer 202CG, an ETL 202DG, an EIL 202EG and a cathode 202FG. The blue light-emitting sub-pixel 202B includes an anode 2021B, an HIL 202AB, an HTL 202BB, an organic light-emitting layer 202CB, an ETL 202DB, an EIL 202EB and a cathode 202FB.

The pixel partition wall 203 includes a lyophilic film layer 203A1, a lyophobic film layer 203B1, a lyophilic film layer 203A2, a lyophobic film layer 203B2, a lyophilic film layer 203A3, a lyophobic film layer 203B3, a lyophilic film layer 203A4 and a lyophobic film layer 203B4.

Not all the HILs of the light-emitting sub-pixels are the same. The HIL 202AR is the thinnest one, and the HIL 202AG and the HIL 202AB are the same in thickness; the HTL 202BR, the HTL 202BG and the HTL 202BB are the same in thickness; and the organic light-emitting layer 202CR, the organic light-emitting layer 202CG and the organic light-emitting layer 202CB are the same in thickness.

The total thickness of the anode 2021R and the HIL 202AR is equal to the thickness of one film layer (namely 203A1) of the pixel partition wall 203 corresponding to the anode 2021R and the HIL 202AR; the total thickness of the anode 2021G and the HIL 202AG is equal to the thickness of three film layers (namely 203A1, 203B1 and 203A2) of the pixel partition wall 203 corresponding to the anode 2021G and the HIL 202AG; and the implementation of the anode 2021B and the HIL 202AB is the same as the implementation of the anode 2021G and the HIL 202AG.

It should be noted that the embodiment of the present invention only illustrates the implementation in which not all the HILs 1022 of the light-emitting sub-pixels 102 are the same, by taking the case that the number of film layers of the pixel partition wall 203 corresponding to the cathode 2021G and the HIL 202AG is an odd number greater than 1 as an example.

In other examples, the number of film layers of the pixel partition wall 203 corresponding to the anode and the HIL of the red light-emitting sub-pixel 202R and/or the green light-emitting sub-pixel 202G and/or the blue light-emitting sub-pixel 202B may all be an odd number greater than 1.

Embodiment 2

In embodiment 2 of the present invention, description will be given to the implementation in which the organic layer is an HTL 1023.

Figure 3:
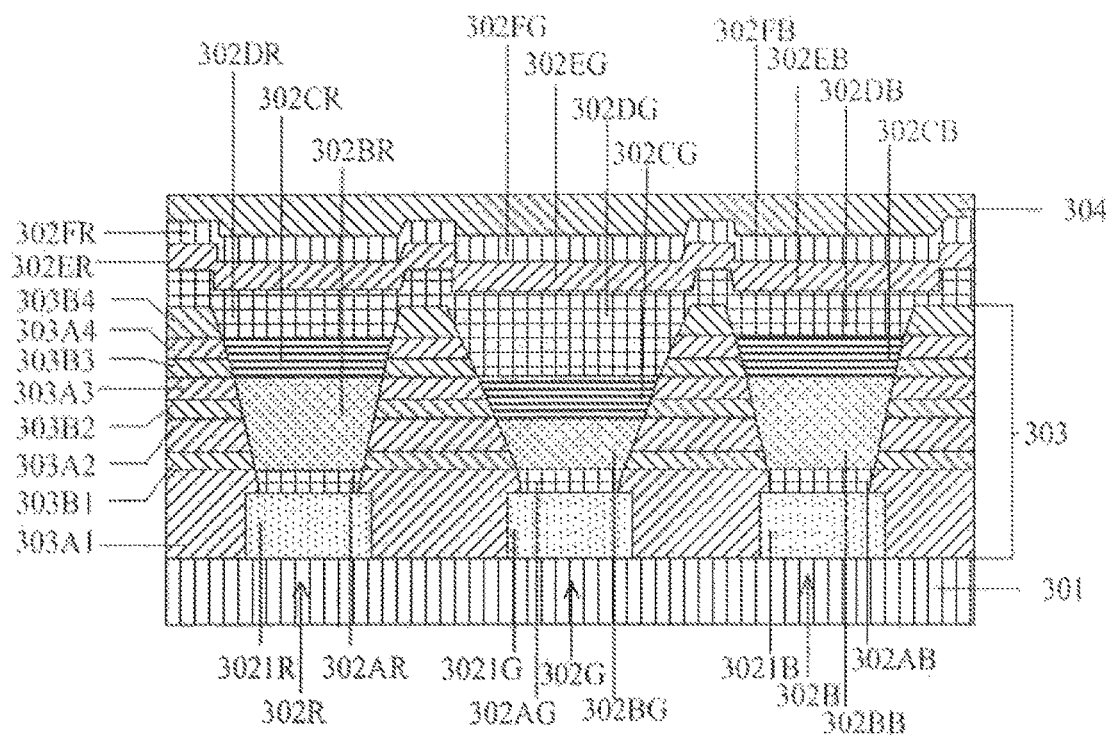
FIG. 3 is a schematic structural view of the OLED substrate provided by an embodiment of the present invention, in which HTLs have different thicknesses.

As illustrated in FIG. 3, the OLED substrate provided by the embodiment of the present invention comprises a base substrate 301, a red light-emitting sub-pixel 302R, a green light-emitting sub-pixel 302G and a blue light-emitting sub-pixel 302B which are disposed on the base substrate 301, a pixel partition wall 303 which are disposed in regions not covered by the light-emitting sub-pixels on the base substrate 301, and a protection layer 304 which is disposed on the red light-emitting sub-pixel 302R, the green light-emitting sub-pixel 302G and the blue light-emitting sub-pixel 302B.

The red light-emitting sub-pixel 302R includes an anode 3021R, an HIL 302AR, an HTL 302BR, an organic light-emitting layer 302CR, an ETL 302DR, an EIL 302ER and a cathode 302FR. The green light-emitting sub-pixel 302G includes an anode 3021G, an HIL 302AG, an HTL 302BG, an organic light-emitting layer 302CG, an ETL 302DG, an EIL 302EG and a cathode 302FG. The blue light-emitting sub-pixel 302B includes an anode 3021B, an HIL 302AB, an HTL 302BB, an organic light-emitting layer 302CB, an ETL 302DB, an EIL 302EB and a cathode 302FB.

The pixel partition wall 303 includes a lyophilic film layer 303A1, a lyophobic film layer 303B1, a lyophilic film layer 303A2, a lyophobic film layer 303B2, a lyophilic film layer 303A3, a lyophobic film layer 303B3, a lyophilic film layer 303A4 and a lyophobic film layer 303B4.

The difference of embodiment 2 from embodiment 1 is that the HILs of the light-emitting sub-pixels in the embodiment 2 are the same and the HTLs of the light-emitting sub-pixels are not all the same. The thickness of the HTL 302BG of the green light-emitting sub-pixel 302G is less than that of the HTL 302BR of the red light-emitting sub-pixel 302R; and the thickness of the HTL 302BR of the red light-emitting sub-pixel 302R is the same as that of the HTL 302BB of the blue light-emitting sub-pixel 302B.

The thickness of the HTL 302BG is equal to the thickness of two film layers (namely 303B1 and 303A2) of the pixel partition wall 303 corresponding to the HTL 302BG; the thickness of the HTL 302BR is equal to the thickness of four film layers (namely, 303B1, 303A2, 303B2 and 303A3) of the pixel partition wall 303 corresponding to the HTL 302BR; and the implementation of the HTL 302BB is the same as the implementation of the HTL 302BR.

It should be noted that the embodiment of the present invention only illustrates the implementation in which the HTLs 1023 of the light-emitting sub-pixels 102 are not all the same, by taking the case that the number of film layers of the pixel partition wall 303 corresponding to the HTL 302BR of the red light-emitting sub-pixel 302R is an even number greater than 2 as an example.

In other examples, the number of film layers of the pixel partition wall 303 corresponding to the HTL of the red light-emitting sub-pixel 302R and/or the green light-emitting sub-pixel 302G and/or the blue light-emitting sub-pixel 302B may all be an even number greater than 2.

Embodiment 3

In embodiment of the present invention, description will be given to the implementation in which the organic layer is an organic light-emitting layer 1024.

Figure 4:
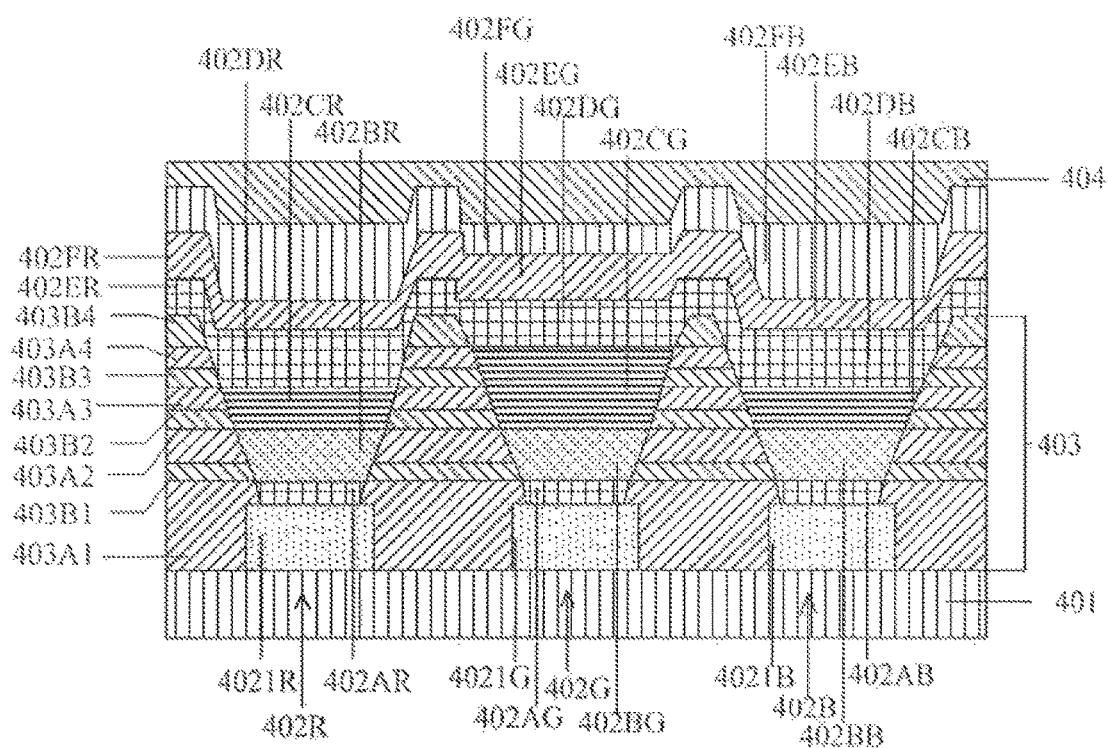
FIG. 4 is a schematic structural view of the OLED substrate provided by an embodiment of the present invention, in which organic light-emitting layers have different thicknesses.

As illustrated in FIG. 4, the OLED substrate provided by the embodiment of the present invention comprises a base substrate 401, a red light-emitting sub-pixel 402R, a green light-emitting sub-pixel 402G and a blue light-emitting sub-pixel 402B which are disposed on the base substrate 401, a pixel partition wall 403 which are disposed in regions not covered by the light-emitting sub-pixels on the base substrate 401, and a protection layer 404 which is disposed on the red light-emitting sub-pixel 402R, the green light-emitting sub-pixel 402G and the blue light-emitting sub-pixel 402B.

The red light-emitting sub-pixel 402R includes an anode 4021R, an HIL 402AR, an HTL 402BR, an organic light-emitting layer 402CR, an ETL 402DR, an EIL 402ER and a cathode 402FR. The green light-emitting sub-pixel 402G includes an anode 4021G, an HIL 402AG, an HTL 402BG, an organic light-emitting layer 402CG, an ETL 402DG, an EIL 402EG and a cathode 402FG. The blue light-emitting sub-pixel 402B includes an anode 4021B, an HIL 402AB, an HTL 402BB, an organic light-emitting layer 402CB, an ETL 402DB, an EIL 402EB and a cathode 402FB.

The pixel partition wall 403 includes a lyophilic film layer 403A1, a lyophobic film layer 403B1, a lyophilic film layer 403A2, a lyophobic film layer 403B2, a lyophilic film layer 403A3, a lyophobic film layer 403B3, a lyophilic film layer 403A4 and a lyophobic film layer 403B4.

The difference of embodiment 3 from embodiment 2 is that the HTLs of the light-emitting sub-pixels in the embodiment 3 are the same and the organic light-emitting layers of the light-emitting sub-pixels are not all the same. The thickness of the organic light-emitting layer 402CG of the green light-emitting sub-pixel 402G is greater than that of the organic light-emitting layer 402CR of the red light-emitting sub-pixel 402R; and the thickness of the organic light-emitting layer 402CR of the red light-emitting sub-pixel 402R is the same as that of the organic light-emitting layer 402CB of the blue light-emitting sub-pixel 402B.

The thickness of the organic light-emitting layer 402CG is equal to the thickness of four film layers (namely 403B2, 403A3, 403B3 and 403A4) of the pixel partition wall 403 corresponding to the organic light-emitting layer 402CG; the thickness of the organic light-emitting layer 402CR is equal to the thickness of two film layers (namely 403B2 and 403A3) of the pixel partition wall 403 corresponding to the organic light-emitting layer 402CR; and the implementation of the organic light-emitting layer 402CB is the same as the implementation of the organic light-emitting layer 402CR.

It should be noted that the embodiment of the present invention only illustrates the implementation in which the organic light-emitting layers 1024 of the light-emitting sub-pixels 102 are not all the same, by taking the case that the number of film layers of the pixel partition wall 403 corresponding to the organic light-emitting layer 402CG of the green light-emitting sub-pixel 402G is an even number greater than 2 as an example.

In other examples, the number of film layers of the pixel partition wall 403 corresponding to the organic light-emitting layer of the red light-emitting sub-pixel 402R and/or the green light-emitting sub-pixel 402G and/or the blue light-emitting sub-pixel 402B may all be an even number greater than 2.

The display device provided by an embodiment of the present invention comprises an OLED substrate.

Figure 5:
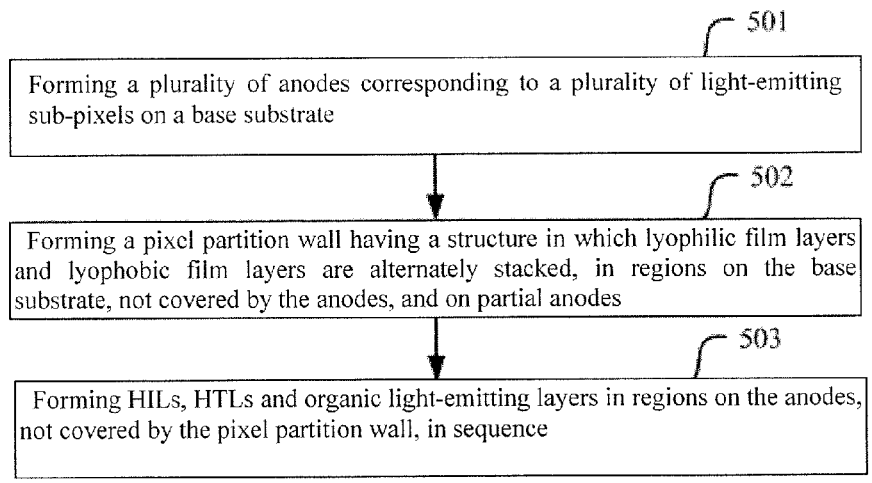
FIG. 5 is a schematic flow sheet of a method for manufacturing the OLED substrate provided by an embodiment of the present invention.

An embodiment of the present invention further provides a method for manufacturing an OLED substrate. As illustrated in FIG. 5, the method for manufacturing the OLED substrate provided in the embodiment of the present invention comprises the following steps:

Step 501: forming a plurality of anodes corresponding to a plurality of light-emitting sub-pixels on a base substrate;

Step 502: forming a pixel partition wall having a structure in which lyophilic film layers and lyophobic film layers are alternately stacked, in regions on the base substrate, not covered by the anodes, and on partial anodes; and Step 503: forming HILs, HTLs and organic light-emitting layers in regions on the anodes, not covered by the pixel partition wall, in sequence.

At least two light-emitting sub-pixels are provided; at least one layer of the HIL, the HTL and the organic light-emitting layer has a different thickness for the at least two light-emitting sub-pixels; and upper surfaces of the HIL, the HTL and the organic light-emitting layer of any light-emitting sub-pixel are each parallel and level to an upper surface of one respective lyophilic film layer of the pixel partition wall.

For instance, the process of forming a plurality of the anodes on the base substrate in the step 501 further includes: forming a transparent electrode conductive film on, for instance, the substrate, and patterning the transparent electrode conductive film.

For instance, a plurality of the anodes corresponding to the plurality of light-emitting sub-pixels, formed on, for instance, the substrate, should be respectively connected with drain electrodes of driving transistors corresponding to the light-emitting sub-pixels.

For instance, the process of forming the pixel partition wall in the regions on the base substrate, not covered by the anodes, and on the partial anodes in the step 502 further includes: forming lyophilic films and lyophobic films which are alternately stacked in the regions on the base substrate, not covered by the anodes, and on the partial anodes, and performing one-time patterning process on the formed lyophilic films and the formed lyophobic films which are alternately stacked; or performing coating or vapor deposition on each film of the lyophilic films and the lyophobic films which are alternately stacked, in the regions on the base substrate, not covered by the anodes, and on the partial anodes and patterning the each film subjected to coating or vapor deposition in sequence.

Detailed description will be given below to the examples of the two methods for forming the pixel partition wall respectively.

The first method: forming the lyophilic films and the lyophobic films which are alternately stacked in the regions on the base substrate, not covered by the anodes, and on the partial anodes, by the process of coating or vapor deposition for times, and performing one-time patterning process on the formed lyophilic films and the formed lyophobic films which are alternately stacked.

It should be noted that the adjacent lower film layer which has been coated and cured cannot be redissolved in a solvent adopted by the adjacent upper film layer when the lyophilic films and the lyophobic films which are alternately stacked are formed by the coating process.

Preferably, when the films for forming the pixel partition wall are made of inorganic materials, the lyophilic films and the lyophobic films which are alternately stacked are formed in the regions on the base substrate, not covered by the anodes, and on the partial anodes by the vapor deposition process.

For instance, any vapor deposition process is applicable in the present invention, such as chemical vapor deposition (CVD), physical vapor deposition (PVD), atomic layer deposition and evaporation.

For instance, when the lyophilic films and the lyophobic films which are alternately stacked are formed in the regions on the base substrate, not covered by the anodes, and on the partial anodes by the vapor deposition process, the wettability of the formed films can be controlled by the control of the deposition rate of the materials of the films for forming the pixel partition wall.

For instance, where the deposition rate of the films is lower, the deposited films are usually denser and have good wettability; and where the deposition rate of the films is higher, film surfaces are relatively sparse and rough, and hence the films have poor wettability.

For instance, the patterning process includes wet etching and dry etching.

For instance, where the films for forming the pixel partition wall are made of photosensitive polymer materials, the lyophilic films and the lyophobic films which are alternately stacked are subjected to the patterning process(es) though wet etching; and where the films for forming the pixel partition wall are made of non-photosensitive polymers or inorganic materials, the lyophilic films and the lyophobic films which are alternately stacked are subjected to the patterning process(es) through dry etching.

For instance, the wet etching process in the embodiment of the present invention may be similar to the traditional wet etching process, and includes the three steps of exposure, development and etching.

For instance, the dry etching process in the embodiment of the present invention is similar to the traditional dry etching process, such as plasma etching and reactive ion etching.

In practice, the cost of the method of performing one-time patterning process on the formed lyophilic films and the formed lyophobic films which are alternately stacked is relatively low.

Detailed description will be given below to the first method by taking the case of forming the pixel partition wall in FIG. 2 by a coating process as an example.

Figure 6A:
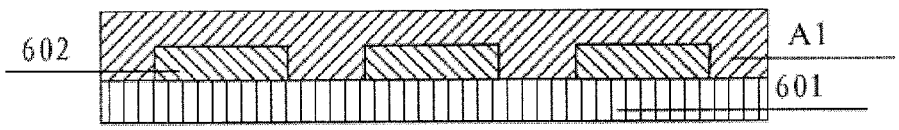
FIGS. 6A to 6E are schematic diagrams illustrating the process of manufacturing a pixel partition wall by the first method in an embodiment of the present invention.

Step M1: forming a lyophilic film A1 on a substrate 601 on which anodes 602 are formed, by a coating process, as illustrated in FIG. 6A.

After the lyophilic film A1 is formed on the substrate 601, whether to execute the steps of drying, removing of solvent, annealing and the like is determined by the characteristics of the lyophilic film A1.

Figure 6B:
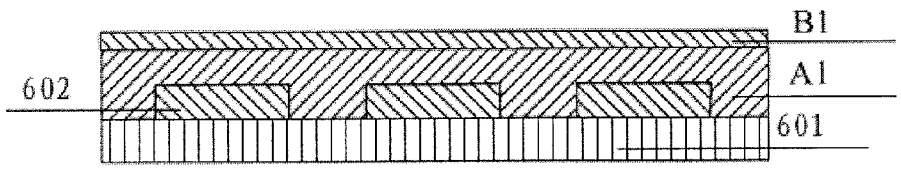

Step M2: forming a lyophobic film B1 on the lyophilic film A1 by a coating process, as illustrated in FIG. 6B.

After the lyophobic film B1 is formed on the lyophilic film A1, whether to execute the steps of drying, solvent removal, annealing and the like is determined by the characteristics of the lyophobic film B1.

Figure 6C:
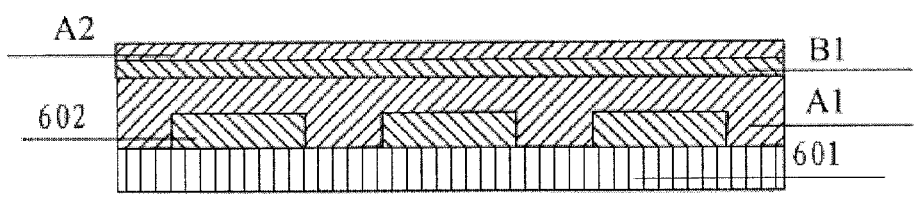

Step M3: forming a lyophilic film A2 on the lyophobic film B1 by a coating process, as illustrated in FIG. 6C.

Figure 6D:
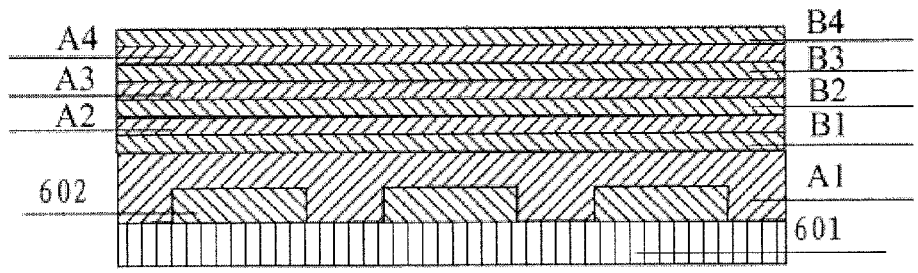
Figure 6E:
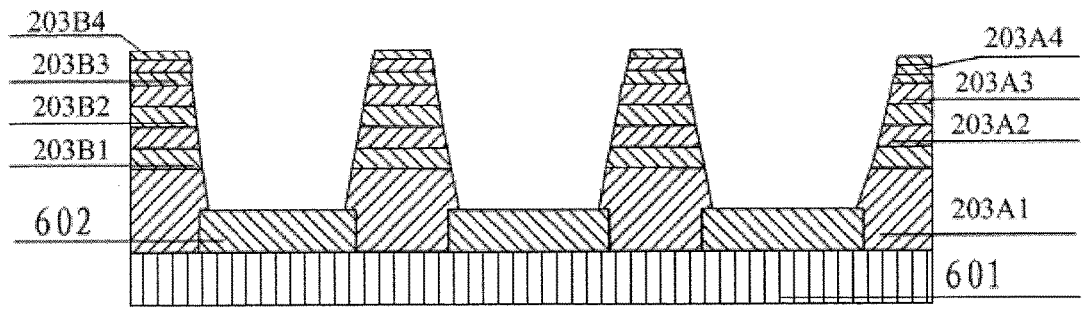

Step M4: forming a lyophobic film B2, a lyophilic film A3, a lyophobic film B3, a lyophilic film A4 and a lyophobic film B4 on the lyophilic film A2 in sequence by coating processes, as illustrated in FIG. 6D.

Step M5: performing one-time patterning process on the formed lyophilic films and the formed lyophobic films which are alternately stacked, and forming a pixel partition wall (203A1, 203B1, 203A2, 203B2, 203A3, 203B3, 203A4 and 203B4) in regions on the substrate, not covered by the anodes, and on partial anodes.

The second method: forming in sequence each film in the lyophilic films and the lyophobic films which are alternately stacked in the regions on the substrate, not covered by the anodes, and on the partial anodes by coating or vapor deposition, and patterning the each film subjected to coating or vapor deposition.

The implementation of the second method is similar to that of the first method. The only difference lies in that the forming sequence of various layers in the pixel partition wall is different. Detailed description will be given below to the second method by taking the case of forming the pixel partition wall in FIG. 2 by a coating process as an example.

Figure 7A:
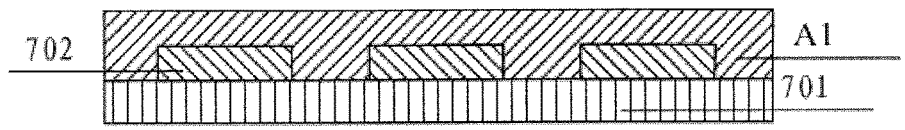
FIGS. 7A to 7E are schematic diagrams illustrating the process of manufacturing a pixel partition wall by the second method in an embodiment of the present invention.

Step N1: forming a lyophilic film A1 on a substrate 701 on which anodes 702 are formed, by a coating process, as illustrated in FIG. 7A.

Figure 7B:
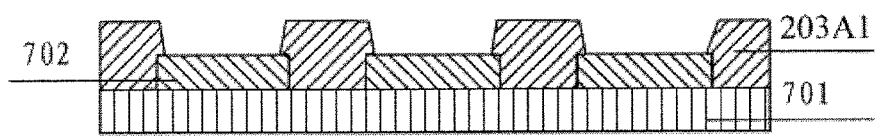

Step N2: performing wet etching on the coated film A1, and obtaining a lyophilic film layer 203A1, as illustrated in FIG. 7B.

Figure 7C:
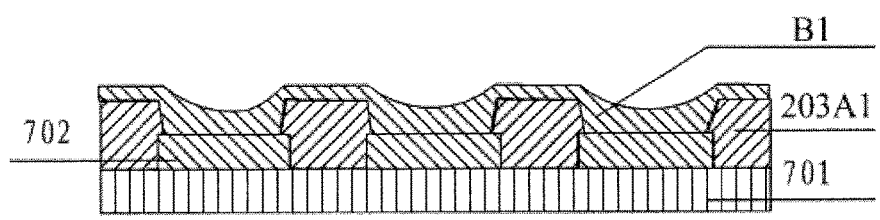

Step N3: forming a lyophobic film B1 on the lyophilic film layer 203A1 and the anodes by a coating process, as illustrated in FIG. 7C.

Figure 7D:
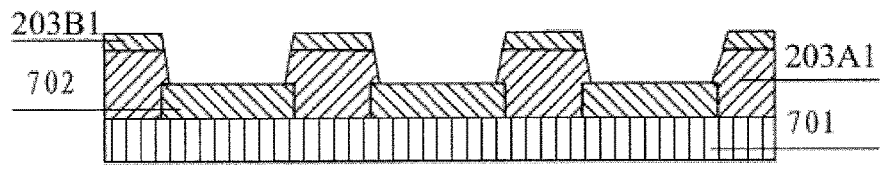

Step N4: performing wet etching on the coated film B1, and obtaining a lyophobic film layer 203B1, as illustrated in FIG. 7D.

Figure 7E:
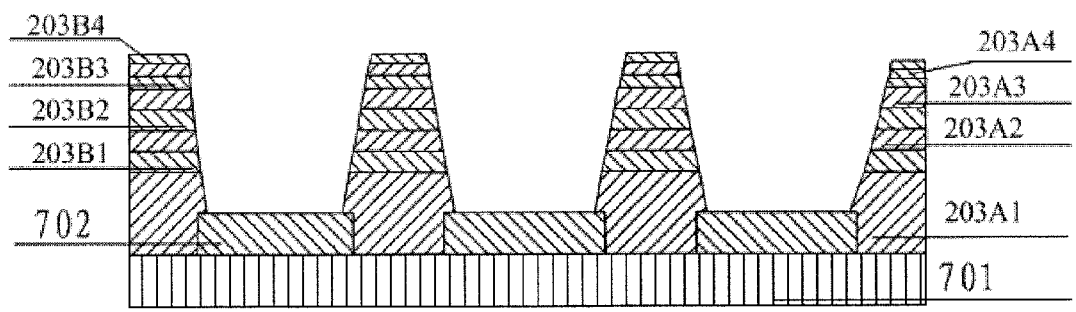

Step N5: forming a lyophilic film layer 203A3, a lyophobic film layer 203B3, a lyophilic film layer 203A4 and a lyophobic film layer 203B4 on the lyophobic film layer 203B1 in sequence by the above method as that for forming the lyophilic film layer 203A1, as illustrated in FIG. 7E.

For instance, the process of forming the HILs in the regions on the anodes, not covered by the pixel partition wall, in the step 503 further includes: forming the HILs in the regions on the anodes, not covered by the pixel partition wall, by a coating process.

For instance, the organic material for forming the HILs is disposed in the regions on the anodes, not covered by the pixel partition wall, by the ink-jet method, and the organic materials disposed in the regions on the anodes, not covered by the pixel partition wall, are subjected to a drying process.

The atmosphere and the temperature of the drying process are relevant to the materials for forming the HILs.

The implementation of forming the HTLs on the HILs is similar to the implementation of forming the HILs in the regions on the anodes, not covered by the pixel partition wall. No further description will be given here.

For instance, the atmosphere of the drying process performed on the organic materials disposed on the HILs and for forming the HTLs, is nitrogen (N2) or ambient air.

For instance, the temperature of the drying process performed on the organic materials disposed on the HILs and for forming the HTLs, is 150 to 300 centigrade. Preferably, the temperature of the drying process perfotmed on the organic materials disposed on the HILs and for forming the HTLs, is 180 to 250 CENTIGRADE.

For instance, as for the organic light-emitting layer of a red light-emitting sub-pixel or a green light-emitting sub-pixel, the implementation of forming the organic light-emitting layer on the HTL is similar to the implementation of forming the HIL at the region on the anode, not covered by the pixel partition wall. No further description will be given here.

For instance, as for the organic light-emitting layer of a blue light-emitting sub-pixel, the implementation of forming the organic light-emitting layer on the HTL is relevant to the organic material for forming the organic light-emitting layer.

For instance, where the organic material for forming the organic light-emitting layer is a polymeric material, the implementation of forming the organic light-emitting layer on the HTL is similar to the implementation of forming the HIL at the region on the anode, not covered by the pixel partition wall; and where the organic material for forming the organic light-emitting layer is a small molecular weight material, the organic light-emitting layer may be formed on the HTL by vapor deposition.

For instance, after the step 503, the method further comprises: forming ETLs, EILs, cathodes and a protection layer on the light-emitting sub-pixels in sequence by vapor deposition.

For instance, the processes for forming the ETLs, the EILs, the cathodes and the protection layer on the plurality of light-emitting sub-pixels in sequence are similar to the traditional processes for forming ETLs, EILs, cathodes and a protection layer on a plurality of light-emitting sub-pixels.

For instance, where the protection layer is formed, the impact of the energy generated by particles on the OLED substrate can be ignored.

Preferably, the protection layer should have enough tightness so as to be able to effectively block the penetration of moisture and oxygen. For instance, the water vapor transmission rate (WVTR) of moisture blocked by the protection layer must be less than $10^{-5}$ g/m$^2$/day.

The foregoing is only the preferred embodiments of the present invention and not intended to limit the scope of protection of the present invention. The scope of protection of the present invention should be defined by the appended claims.

The invention claimed is:

1. An organic light-emitting diode (OLED) substrate, comprising:
a base substrate;
a plurality of light-emitting sub-pixels disposed on the base substrate; and
a pixel partition wall disposed on the base substrate, wherein:
each of the light-emitting sub-pixels includes an anode disposed over the base substrate, a hole injection layer (HIL) disposed over the anode, a hole transport layer (HTL) disposed over the HIL, and an organic light-emitting layer disposed over the HTL;
the pixel partition wall includes film layers comprising lyophilic film layers and lyophobic film layers which are alternately stacked; a bottom one of the lyophilic film layers is disposed as the bottommost layer of the pixel partition wall; a top one of the lyophobic film layers is disposed as the uppermost layer of the pixel partition wall;

at least two of the light-emitting sub-pixels are different in thickness of at least one of the HIL, the HTL, and the organic light-emitting layer; and each of the HIL, the HTL and the organic light-emitting layer of any of the light-emitting sub-pixels has an upper surface parallel and level to an upper surface of a respective one of the lyophilic film layers of the pixel partition wall;

a total number of film layers of the pixel partition wall corresponding to the anode and the HIL for each of the light-emitting sub-pixels is an odd number;

a total number of film layers of the pixel partition wall corresponding to the HTL or the organic light-emitting layer for each of the light-emitting sub-pixels is an even number;

the at least two of the light-emitting sub-pixels are different in thickness of the HIL, one of the at least two of the light-emitting sub-pixels having a thickest HIL and another one of the at least two of the light-emitting sub-pixels having a thinnest HIL;

the anode, the HIL, the HTL and the organic light-emitting layer of the one of the at least two of the light-emitting sub-pixels are separated respectively from the anode, the HIL, the HTL and the organic light-emitting layer of the another one of the at least two of the light-emitting sub-pixels by the pixel partition wall;

a total number of film layers of the pixel partition wall corresponding to the anode and the thickest HIL is a first odd number greater than 1, and a total number of film layers of the pixel partition wall corresponding to the anode and the thinnest HIL is a second odd number not less than 1; and the anode and the thickest HIL of the one of the at least two of the light-emitting sub-pixels correspond to the bottom one of the lyophilic film layers, a bottom one of the lyophobic film layers and another one of the lyophilic film layers of the pixel partition wall, the bottom one of the lyophilic film layers being separated from the another one of the lyophilic film layers by the bottom one of the lyophobic film layers.

2. The OLED substrate according to claim 1, wherein the at least two of the light-emitting sub-pixels are different in thickness of the HTL; and a total number of film layers of the pixel partition wall corresponding to a thickest HTL is greater than 2, and a total number of film layers of the pixel partition wall corresponding to a thinnest HTL is not less than 2.

3. The OLED substrate according to claim 1, wherein the at least two of the light-emitting sub-pixels are different in thickness of the organic light-emitting layer; and a total number of film layers of the pixel partition wall corresponding to a thickest organic light-emitting layer is greater than 2, and a total number of film layers of the pixel partition wall corresponding to a thinnest organic light-emitting layer is not less than 2.

4. The OLED substrate according to claim 1, wherein the lyophilic film layers or the lyophobic film layers have a thickness of from 5 nm to 100 nm.

5. The OLED substrate according to claim 1, wherein the lyophilic film layers are made of an inorganic material and/or an organic material with polar groups.

6. The OLED substrate according to claim 1, wherein the lyophobic film layers are made of an inorganic material and/or an organic material with low surface energy.

7. A display device, comprising:
an organic light-emitting diode (OLED) substrate, the OLED substrate comprising:
a base substrate;
a plurality of light-emitting sub-pixels disposed on the base substrate; and
a pixel partition wall disposed on the base substrate, wherein:

each of the light-emitting sub-pixels includes an anode disposed over the base substrate, a hole injection layer (HIL) disposed over the anode, a hole transport layer (HTL) disposed over the HIL, and an organic light-emitting layer disposed over the HTL;

the pixel partition wall includes film layers comprising lyophilic film layers and lyophobic film layers which are alternately stacked; a bottom one of the lyophilic film layers is disposed as the bottommost layer of the pixel partition wall; a top one of the lyophobic film layers is disposed as the uppermost layer of the pixel partition wall;

at least two of the light-emitting sub-pixels are different in thickness of at least one of the HIL, the HTL, and the organic light-emitting layer; and each of the HIL, the HTL and the organic light-emitting layer of any of the light-emitting sub-pixels has an upper surface parallel and level to an upper surface of a respective one of the lyophilic film layers of the pixel partition wall;

a total number of film layers of the pixel partition wall corresponding to the anode and the HIL for each of the light-emitting sub-pixels is an odd number;

a total number of film layers of the pixel partition wall corresponding to the HTL or the organic light-emitting layer for each of the light-emitting sub-pixels is an even number;

the at least two of the light-emitting sub-pixels are different in thickness of the HIL, one of the at least two of the light-emitting sub-pixels having a thickest HIL and another one of the at least two of the light-emitting sub-pixels having a thinnest HIL;

the anode, the HIL, the HTL and the organic light-emitting layer of the one of the at least two of the light-emitting sub-pixels are separated respectively from the anode, the HIL, the HTL and the organic light-emitting layer of the another one of the at least two of the light-emitting sub-pixels by the pixel partition wall;

a total number of film layers of the pixel partition wall corresponding to the anode and the thickest HIL is a first odd number greater than 1, and a total number of film layers of the pixel partition wall corresponding to the anode and the thinnest HIL is a second odd number not less than 1; and the anode and the thickest HIL of the one of the at least two of the light-emitting sub-pixels correspond to the bottom one of the lyophilic film layers, a bottom one of the lyophobic film layers and another one of the lyophilic film layers of the pixel partition wall, the bottom one of the lyophilic film layers being separated from the another one of the lyophilic film layers by the bottom one of the lyophobic film layers.

8. The OLED substrate according to claim 2, wherein the at least two light-emitting sub-pixels are different in thickness of the organic light-emitting layer; and a total number of film layers of the pixel partition wall corresponding to a thickest organic light-emitting layer is greater than 2, and a total number of film layers of the pixel partition wall corresponding to a thinnest organic light-emitting layer is not less than 2.

9. The OLED substrate according to claim 2, wherein the lyophilic film layers or the lyophobic film layers have a thickness of from 5 nm to 100 nm.

10. The OLED substrate according to claim 3, wherein the lyophilic film layers or the lyophobic film layers have a thickness of from 5 nm to 100 nm.

11. The OLED substrate according to claim 2, wherein the lyophilic film layers are made of an inorganic material and/or an organic material with polar groups.

12. The OLED substrate according to claim 3, wherein the lyophilic film layers are made of an inorganic material and/or an organic material with polar groups.

* * * * *